United States Patent [19]

Fukuta

[11] Patent Number: 4,516,119
[45] Date of Patent: May 7, 1985

[54] LOGIC SIGNAL DISPLAY APPARATUS

[75] Inventor: Minoru Fukuta, Tokyo, Japan

[73] Assignee: Sony/Tektronix Corporation, Tokyo, Japan

[21] Appl. No.: 420,141

[22] Filed: Sep. 20, 1982

[30] Foreign Application Priority Data

Dec. 17, 1981 [JP] Japan .................................. 56/204170

[51] Int. Cl.³ ............................................. G09G 1/16
[52] U.S. Cl. .................................... 340/722; 340/728; 340/735
[58] Field of Search ............... 340/721, 722, 747, 753, 340/754, 728, 723, 735, 790

[56] References Cited

U.S. PATENT DOCUMENTS

| | | | |
|---|---|---|---|
| 3,573,789 | 4/1971 | Sharp | 340/728 |
| 4,193,122 | 3/1980 | Bowers | 340/728 |
| 4,445,115 | 4/1984 | Rudgard | 340/721 |

Primary Examiner—Marshall M. Curtis
Attorney, Agent, or Firm—John H. Bouchard; Francis I. Gray

[57] ABSTRACT

An apparatus for displaying logic signals on a raster scan type display device is disclosed. A memory circuit stores a plurality of basic patterns corresponding to segments of a logic waveform. The basic patterns are selected from the memory circuit in accordance with the logic signal and are applied to an edge generator for generating an intensity control signal for varying the intensity of an electron beam generated within the raster scan type display device.

4 Claims, 12 Drawing Figures

| A | B | C | D |
|---|---|---|---|
| N+1 [1\|1\|1] | N+2 [1\|1\|0] | N+3(c) [1\|0\|1] | N+4(b) [1\|0\|0] |
| N+9 [1\|1\|1] | N+10 [1\|1\|0] | N+11(c') [1\|0\|1] | N+12(b') [1\|0\|0] |
| N+17 [0\|0\|0] | N+18 [0\|0\|1] | N+19(c") [0\|1\|0] | N+20(b") [0\|1\|1] |

| E | F | G | H |
|---|---|---|---|
| N+5 [0\|1\|1] | N+6 [0\|1\|0] | N+7 [0\|0\|1] | N+8(a) [0\|0\|0] |
| N+13 [0\|1\|1] | N+14 [0\|1\|0] | N+15 [0\|0\|1] | N+16(a') [0\|0\|0] |
| N+21 [1\|0\|0] | N+22 [1\|0\|1] | N+23 [1\|1\|0] | N+24(a") [1\|1\|1] |

LOGIC SIGNAL DISPLAY APPARATUS

BACKGROUND OF THE INVENTION

The present invention relates generally to a logic signal display apparatus, more specifically, to an apparatus for displaying, a logic signal on a raster scan type display device associated with a logic analyzer or the like.

In various kinds of electronic apparatus, logic signal processing techniques are increasingly popular as a result of development of microprocessors and computers. Oscilloscopes, logic probes and logic analyzers are utilized for developing, calibrating and trouble-shooting any electronic apparatus using logic circuiting techniques. In addition, logic analyzers are ideal as a measurement instrument for such an electronic aparatus, because they can store multi-channel input logic signals (data) in a memory, such as random access memories and can display the data, stored in the memory, on a display means, such as a cathode ray tube (CRT), so that the data, before trigger signal occurrence, can be measured. There are two display modes in logic analyzers, one being a timing display mode for displaying the logic signal as a signal waveform, and the other being a state display mode for displaying the stored data as alphanumerics of words, such as binary, octal and hexadecimal.

A raster scan type display device is suitable for the display means of logic analyzers, since the raster scan type display device can display the data in both timing and state display modes, and is flicker free even if a great deal of information is displayed. Moreover, a raster scan type display device is capable of inverting black and white with respect to the entire display or a partial display and blinking the display.

For displaying the logic signals in the Timing Display Mode using the raster scan type display device in a conventional manner, the display waveform patterns must be previously stored in a waveform display read only memory (ROM). When the input logic signal is displayed as the timing waveform on the CRT, a code signal of the waveform pattern (stored in the ROM), corresponding to the input logic signal, is stored in a random access memory (RAM) as FONT information (corresponding to an address of the ROM), and the waveform pattern stored in the ROM is read out in accordance with the FONT information stored in the RAM. Since the prior art must store all kinds of the waveform patterns for the display waveform in the ROM, a large capacity ROM is needed. A large capacity ROM is expensive. If a logic waveform segment (FONT) consists of many waveform elements, the variety of the waveform patterns increases and a much large capacity is needed for the ROM. On the other hand, if a number of the elements for the waveform segments is decreased thereby decreasing the number of the waveform patterns to be stored in the ROM, the display RAM requires a larger capacity (since a large number of the waveform patterns, namely, the FONT information, must be stored in the display RAM.)

Figure 1:
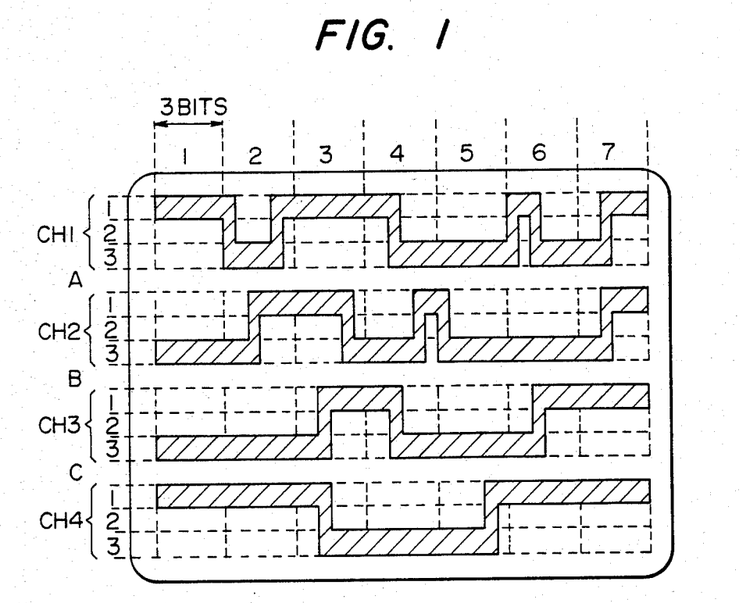
FIG. 1 shows a model of logic timing waveforms displayed in a raster scan type manner.

FIG. 1 shows a model of the timing waveforms of the logic signals displayed in the raster scan system. For simplifying an explanation of FIG. 1, four channels (CH1 through CH4) are displayed, and each channel display includes three raster scan lines (1, 2, 3) and consists of seven waveform segments (FONTs). In other words, one waveform segment consists of 3×3 bits. Raster scan lines (A, B, C) of FIG. 1 are provided to separate the channels from one another.

Figure 2:
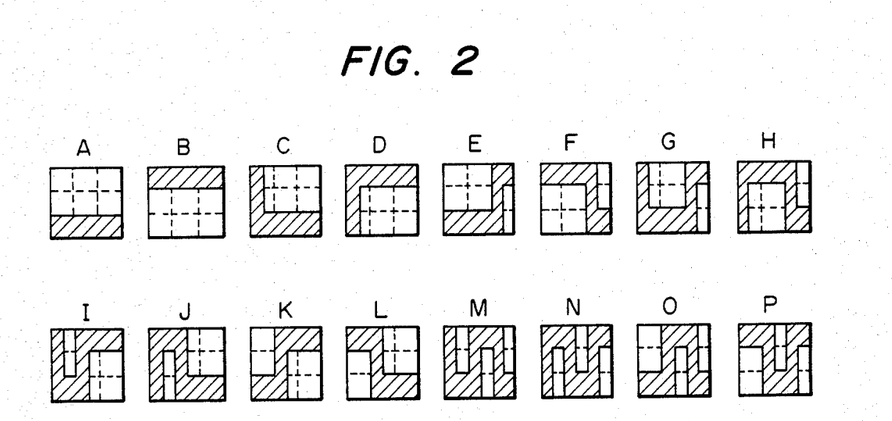
FIG. 2 shows waveform patterns.

Sixteen kinds of the waveform patterns, such as A through P of FIG. 2, have to be stored in the ROM for displaying FIG. 1 in a conventional manner. Assuming that the horizontal bit number of each waveform segment is three bits, and transitions occur every three bits, rising and falling edges (transitions) cannot be displayed. Thus, the widths of the rising and falling edges must be narrower than that of the logic level (one bit). For making the widths of the rising and falling edges a half width of one logic level, six bits are necessary for each segment in the horizontal direction, and the ROM must have a large capacity.

SUMMARY OF THE INVENTION

According to the logic signal display apparatus of the present invention, a number of waveform patterns stored in ROMs may be decreased by use of special patterns as the FONT information. The stored pattern in the ROMs is read out selectively in accordance with the input logic signal, and the parallel output bits from the ROMs are converted to a serial digital signal by a shift register. Transition detection means generate level signals ("high and low") in response to the serial digital signal and further generate a transition signal in accordance with a relation between the former and later bits of the serial digital signal. The output from the transition detection means controls the intensity of the raster scan lines of the display device to display the logic timing waveforms. The width of the displayed transition edges can be less than one bit, e.g., a half bit, because of the transition detection means function. Thus, the capacity of the ROMs may be less than that of the prior art, for example, one-fourth of the conventional ROMs. In addition, since the transition detection means may be a combination of conventional logic integrated circuits (ICs), it is simple and inexpensive in construction.

It is, therefore, an object of the present invention to provide a logic signal display apparatus which decreases a memory capacity of a ROM for a logic signal timing waveform display, improves a usage efficiency of the ROM, is inexpensive in construction by use of basic patterns, and provides an additional simple logic circuit, a number of basic patterns being much less than that of conventional waveform segment patterns.

It is another object to provide a display apparatus which eliminates waste time with respect to a display RAM and improves a usage efficiency of said RAM.

It is a further object to provide a display apparatus which can display a glitch as distinguished from a transition of a timing waveform, even if the glitch is superimposed on the transition when a timing waveform and glitches are displayed simultaneously.

Other objects and advantages of the present invention will become apparent to those having ordinary skill in the art when taken in conjunction with the accompanying drawings.

BRIEF DESCRIPTION OF THE DRAWINGS

A full understanding of the present invention will be obtained from the detailed description given hereinbelow and the accompanying drawings, which are given by way of illustration only, and are not limitative of the present invention, and wherein.

DETAILED DESCRIPTION OF THE PREFERRED EMBODIMENT

Figure 4:
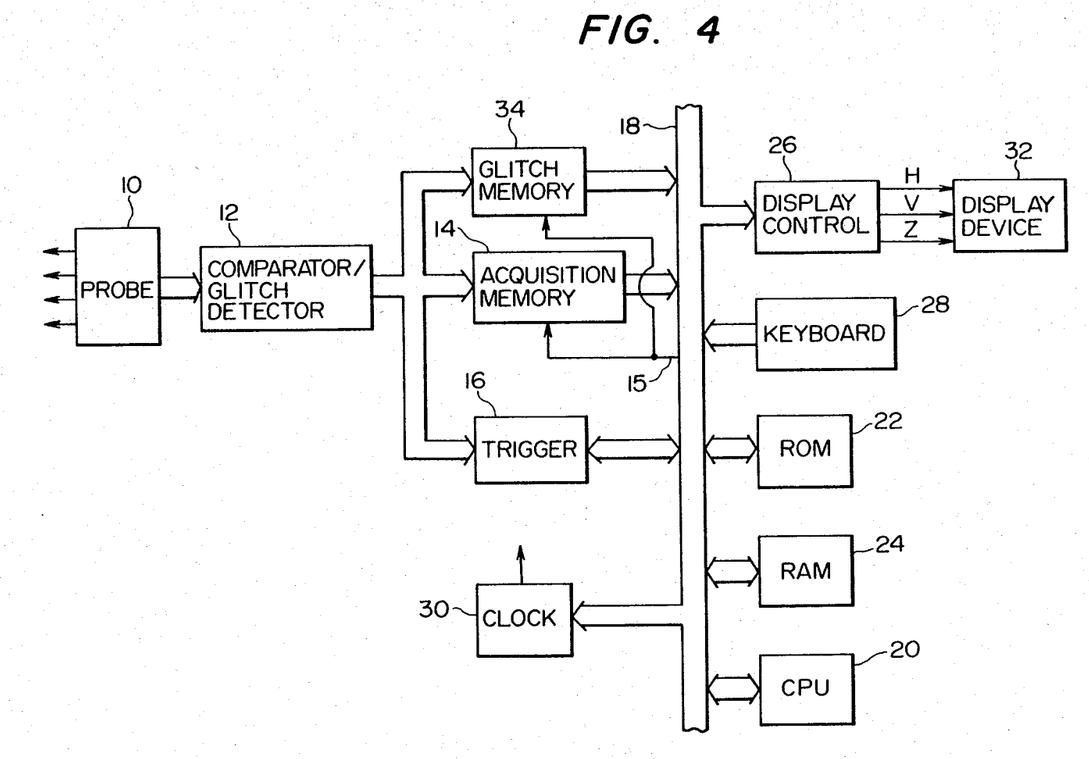
FIG. 4 shows block diagram of a logic analyzer using the present invention.

Referring to FIG. 4, there is shown a block diagram of a logic analyzer using the present invention. The logic input signals detected by probe 10 are applied to comparator/glitch detection circuit 12. Circuit 12 compares the logic input signals with a predetermined level to adjust them to a predetermined logic level (such as the TTL level) proper for each block so as to apply them to acquisition memory 14 and trigger circuit 16, and detects glitches from the input signals to apply the glitches to glitch memory 34. Memories 14 and 34 consist of high speed Random-Access-Memory (RAMs), and trigger circuit 16 includes a word recognizer and a counter. When trigger circuit 16 detects a desired word from the input signals, it generates a write stop signal. The write stop signal is applied to acquisition memory 14 and glitch memory 34 through bus 18 (for transmitting data, address and control signals) and line 15 so as to stop the acquisitions of memories 14 and 34. Memories 14 and 34 further receive a write command signal via line 15. Bus 18 is connected to central processing unit (CPU) 20, such as type Z-80A microprocessor, Read-Only-Memory (ROM) 22, RAM 24, display control apparatus 26 relating to the present invention, keyboard 28 and clock signal generator 30, except for memories 14 and 34, and trigger circuit 16. CPU 20 acts as logic arithmetic means and processing means for controlling the entire system by using RAM 24 as a temporary memory in accordance with the firmware (processing procedure) of ROM 22. Keyboard 28 is an external input device for inputting data, control signals or the like by an operator. Clock signal generator 30 applies a clock signal to each block, wherein the clock signal frequency is determined by a command signal from bus 18. For example, the clock frequency for CPU 20, ROM 22, RAM 24 and keyboard 28 is determined to be 4 MHz (assuming the CPU 20 is the Z-80A). Display control apparatus 26 is connected to a raster scan type display device 32, such as a CRT, and supplies a horizontal sync. signal H, a vertical sync. signal V and an intensity signal Z as described hereinafter. Display control apparatus 26 includes a display RAM.

The operation of the logic analyzer shown in FIG. 4 will be discussed beginning with input data acquisition and ending with input data display on the CRT. An operator connects probe 10 to a circuit to be measured. The remaining sequential steps in the operation of the present invention are as follows:

(1) When the operator enters the input data via keyboard 28, the write (acquisition start) command signal is applied to acquisition and glitch memories 14 and 34 from CPU 20.

(2) Memories 14 and 34 acquire the input logic signal and the glitch from circuit 12 in accordance with the write command signal, and store them sequentially in predetermined memory areas.

(3) When trigger circuit 16 detects the trigger word from the input data and counts a predetermined number of the clock signals, trigger circuit 16 applies the write stop signal to memories 14 and 34.

(4) Memories 14 and 34 stop aquiring the logic signal and the glitch in accordance with the write stop signal.

(5) The operator displays the data, stored in memories 14 and 34, via keyboard 28.

(6) CPU 20 transfers the stored data in memories 14 and 34 to CPU RAM 24, and processes the data for converting the data into the FONT and ATTRIBUTE information. This information is transferred to the display RAM in the display control apparatus 26, and the contents of the display RAM are displayed on display device 32.

Figure 3:
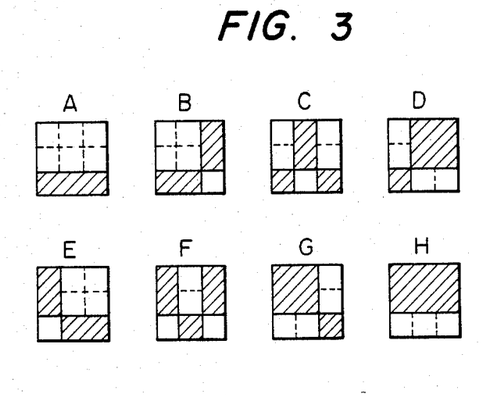
FIG. 3 shows basic patterns used in the present invention.
Figure 5:
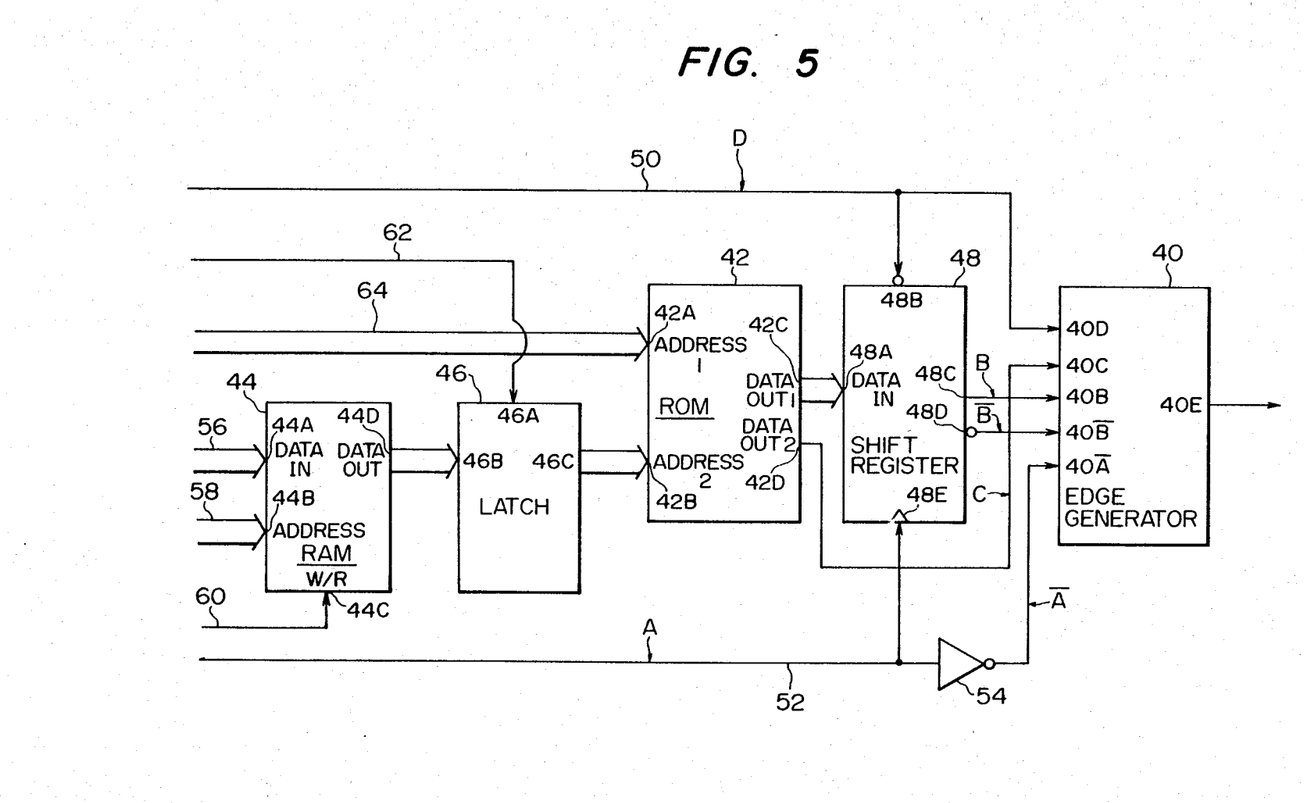
FIG. 5 shows a block diagram of one embodiment of a displayed apparatus according to the present invention used in FIG. 4.
Figure 6:
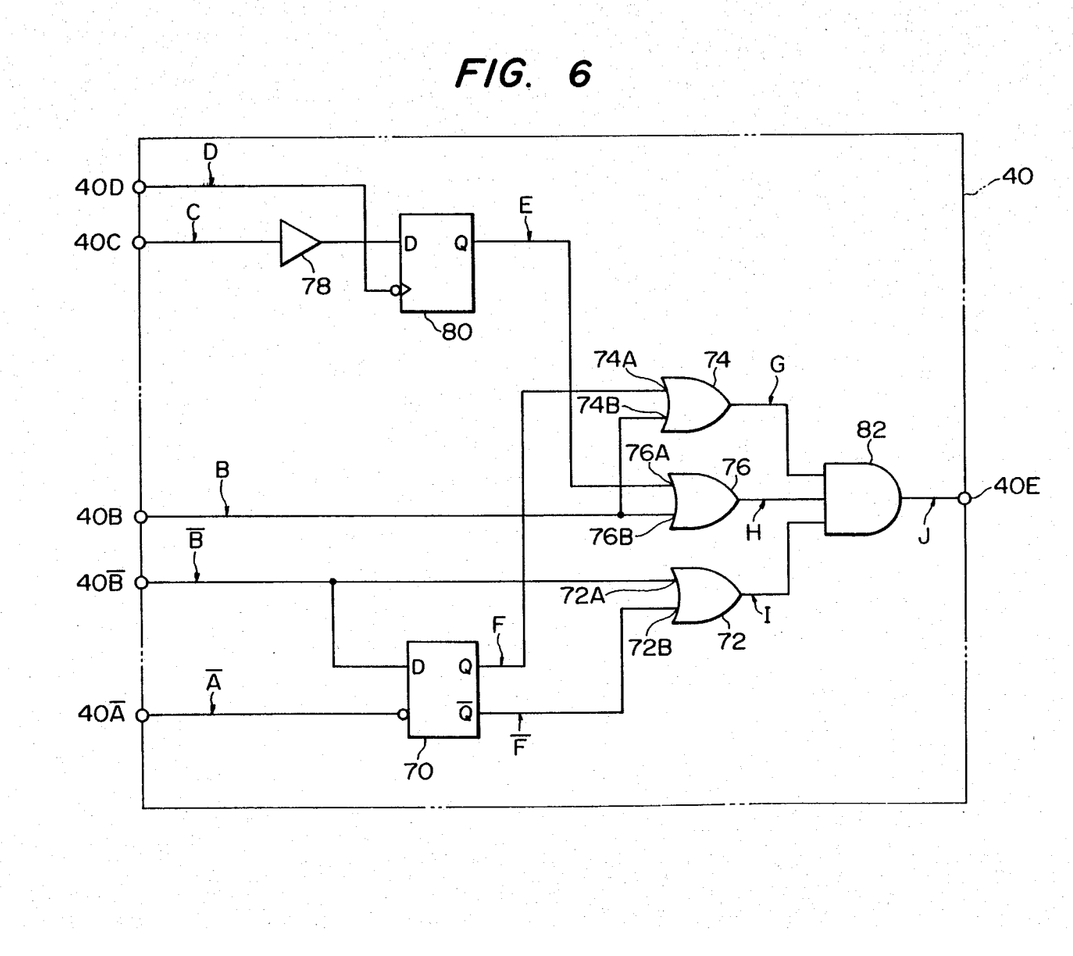
FIG. 6 shows a circuit schematic of one embodiment of an edge generator (transition detection means) used in FIG. 5.
Figure 7:
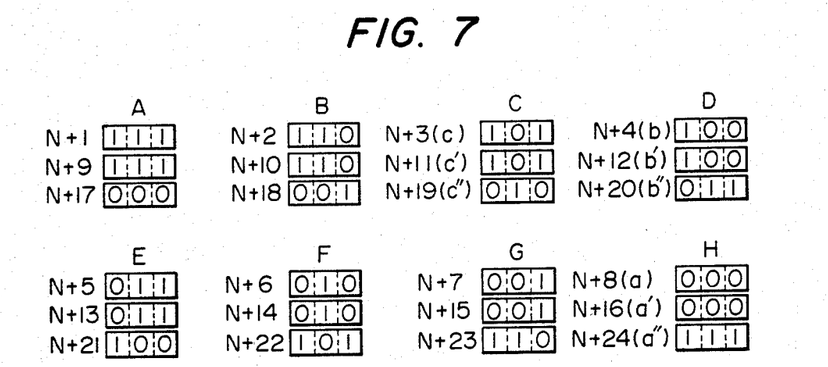
FIG. 7 shows the contents of a ROM for explaining the operation of the present invention.

As is understood from the above explanation of operation, the present invention relates to the sixth step. FIG. 5 is a block diagram of display control apparatus 26 in FIG. 4 and FIG. 6 is a circuit schematic of one example of edge generator 40 (transition rising and falling edges generators, namely, transition detection means). In FIG. 5, a ROM 42 (logic memory means) stores waveforms (and characters), and stores eight kinds of basic patterns A through H as shown in FIG. 3 where in this embodiment, each basic pattern consists of 3×3 bits. These patterns are only one example for simplfying the explanation of the present invention. In other words, three-bit-signals are stored in each of addresses N+1 through N+24 (N: positive integer) as shown in FIG. 7, wherein N+1 through N+24 indicate the addresses of ROM 42, groups A through H correspond respectively to the basic patterns A through H of FIG. 3, and logic values "1" and "0" correspond respectively to white and black bits of FIG. 3. Element No. 44 indicates a display RAM (readout means) for a display logic waveform, and 44A, 44B, 44C and 44D respectively indicate data input (DATA IN), address, write/read control (W/R) and data output (DATA OUT) terminals of RAM 44. These terminals 44A, 44B, and 44C are connected to bus 18 (FIG. 4) via lines 56, 58, and 60, respectively. Latch circuit 46 latches a code signal of a basic pattern from output terminal 44D of RAM 44 in accordance with a latch signal applied to terminal 46A via line 62, and circuit 46 supplies an output from output terminal 46C to a second address teminal (ADDRESS 2) 42B of ROM 42. A line of a desired basic pattern is selected from the basic patterns stored in ROM 42 in response to the address signal at terminal 42B and a line selection signal is applied to the second address terminal (ADDRESS 2) 42B of ROM 42. A line of a desired basic pattern is selected from the basic patterns stored in ROM 42 in response to the address signal at terminal 42B and a line selection signal is applied to the first address terminal (ADDRESS 1) 42A from bus 18 through line 64. The line signal of the selected basic pattern appears at data output terminal 5 (DATA OUT 1) 42C. As described hereinafter, ROM 42 generates, at data output terminal (DATA OUT 2) 42D, a signal to indicate a position of a scan line of the timing waveform corresponding to line signals from output terminals 48C and 48D of shift register 48. Shift register 48 loads the basic pattern signal from data output terminal (DATA OUT 1) 42C of ROM 42 in accordance with a load signal D applied to input terminal 48B via line 50 and in synchronism with a clock signal A applied to clock terminal 48E, wherein the load operation is delayed from the signal acquisition of latch circuit 46 by three bits, because the response of ROM 42 is slow. Shift register 48 converts the parallel logic input signal to the serial logic output signals, and applies the push-pull output signal from terminals 48C and 48D to input terminals 40B and $\overline{40B}$ of edge generator 40. The other input terminals $40\overline{A}$, 40C and 40D of edge generator 40 receive signals from inverter 54 (acting as 180 degrees phase shifter), from data output terminal 42D of RAM 42 and from line 50, respectively. Edge generator 40 applies a logic timing waveform signal from output terminal 40E to a Z-axis circuit of the CRT in accordance with the signals at terminals $40\overline{A}$ through 40D as described hereinafter. In FIG. 5, A, $\overline{A}$, B, $\overline{B}$, C and D represent signals at lines indicated by arrows, and these signals will be discussed hereinafter. Since the horizontal and vertical circuits of the CRT have no relation to the present invention, these circuits are not shown in FIG. 5.

FIG. 6 shows one embodiment of edge generator 40 (shown in FIG. 5), wherein input terminals $40\overline{A}$ and $\overline{40B}$ are respectively connected to a clock terminal and a data terminal D of D flip-flop 70, and terminal $\overline{40B}$ is further connected to input terminal 72A of OR circuit 72. An output terminal $\overline{Q}$ of D flip-flop 70 is connected to input terminal 72B of OR circuit 72, and output terminal Q thereof is connected to input terminal 74A of OR circuit 74. Input terminal 40B is connected to input terminal 74B of OR circuit 74 and input terminal 76B of OR circuit 76. Input terminal 40C is connected to a data terminal D of D flip-flop 80 through buffer amplifier 78, and input terminal 40D is connected to a clock terminal of D flip-flop 80. An output terminal Q of D flip-flop 80 is connected to input terminal 76A of OR circuit 76. The output terminals of OR circuits 72, 74 and 76 are connected to input terminals of AND circuit 82 with an output terminal connected to output terminal 40E of edge generator 40. In FIG. 6, E, F, $\overline{F}$, G, H, I and J represent logic signals at lines indicated by arrows, and these signals will be discussed by reference to FIG. 8.

The basic operation of the present invention is as follows. In FIG. 3, white-black ("1" and "0") data at the upper and lower (corresponding) lines of the basic patterns is used directly. In lines between the upper and lower lines, namely, the center (corresponding) lines, the data is compared with the former data every each bit, and the transition is displayed with the black when the data is different from each other. Even if each basic pattern is generated sequentially, the same comparison operation may be done, i.e., the last bit of the former basic pattern may be compared with the first bit of the present basic pattern. For example, assuming that the 1st bit at the center line of the former basic pattern is the black, the basic pattern C displays as follows. In the upper line, only the center bit is the black. In the center line, the transition will be displayed, since the first bit is the white and is different from the former bit (the former basic pattern). Moreover, the transition will be displayed with the black every bit, since the center bit is different from the first and last bits. In the lower line, the first and last bits are the black. Thus, the display waveform corresponds to the waveform pattern M of FIG. 2. Thus, if the last bit at the center line of the former basic pattern is the white, the basic pattern A corresponds to the waveform pattern A; the basic pattern B to the waveform pattern E; the basic pattern C to the waveform pattern O; the basic pattern D to the waveform pattern K; the basic pattern E to the waveform pattern J; the basic pattern F to the waveform pattern N; the basic pattern G to the waveform pattern H; the basic pattern H to the waveform pattern D. If the last bit at the center line of the former basic pattern is the black, the basic patterns A through H correspond to the waveform patterns C, G, M, I, L, P, F and B of FIG. 2, respectively. When the serial input logic signal is "0,0,0", the basic pattern A is selected. Similarly, the logic signal "0,0,1" selects the basic pattern B, the logic signal "0,1,0" selects the basic pattern C, the logic signal "0,1,1" selects the basic pattern D, the logic signal "1,0,0" selects the basic pattern E, the logic signal "1,0,1" selects the basic pattern F, the logic signal "1,1,0" selects the basic pattern G, and the logic signal "1,1,1" selects the basic pattern H. In other words, the logic levels at the corresponding lower line of the basic pattern are determined in accordance with the logic levels of the input signal, and the logic levels at the corresponding upper line are the reverse logic levels at the corresponding lower line. The logic levels at the corresponding middle (center) line(s) are the same logic levels as the corresponding upper or lower line. It will be discussed in detail hereinafter the ways in which to control the transition width and to display the upper and lower lines.

Figure 8:
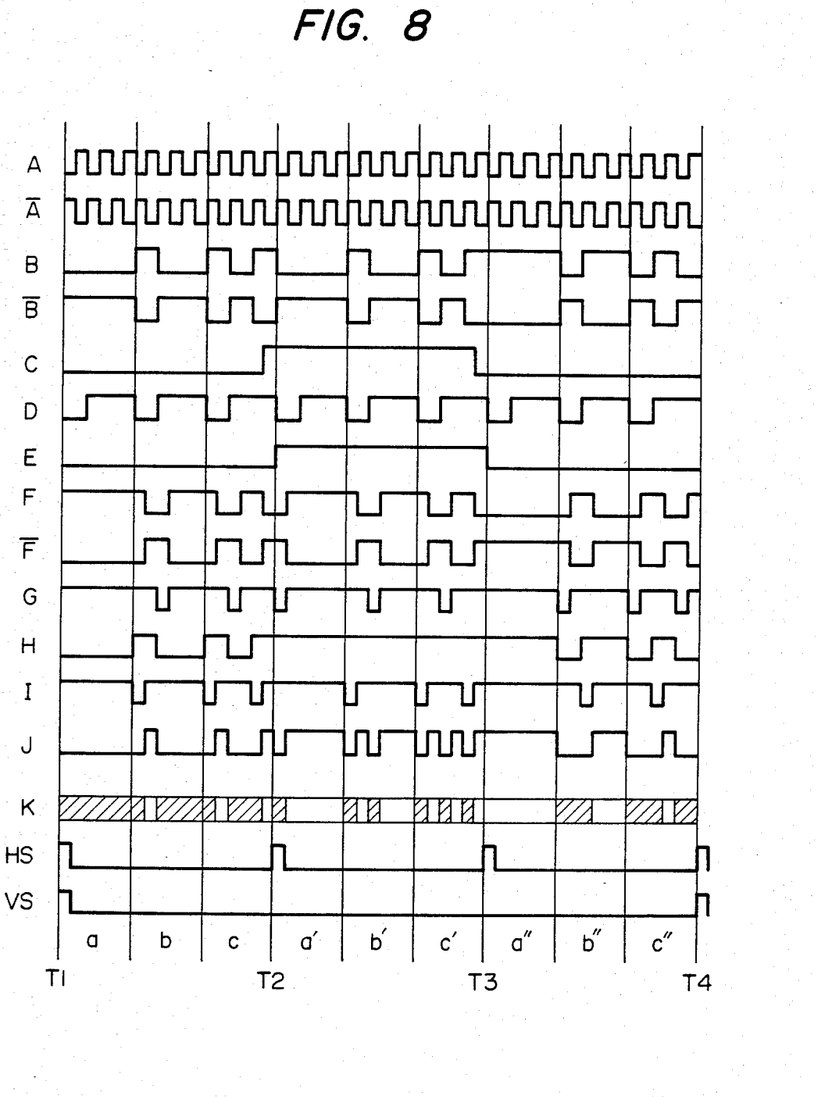
FIG. 8 shows a timing chart for explaining the operation of the present invention.
Figure 9:
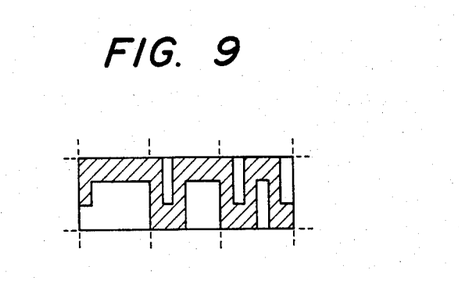
FIG. 9 shows one part of a displayed waveform model for explaining the operation of the present invention.

The operation of the first embodiment according to the present invention will be discussed in detail by reference to the time chart of FIG. 8 and the timing display waveform of FIG. 9. For simplifying the explanation of FIGS. 8 and 9, this embodiment uses the basic patterns H, D and C of FIG. 3 stored in ROM 42 to display the timing waveform of FIG. 9. In FIG. 8, A through J indicate the logic signals at the lines of FIGS. 5 and 6 described hereinbefore, K is the timing display waveform corresponding to the signal J, a, b, c, a', b', c', a'', b'' and c'' correspond to the logic signals represented by the same alphabets in FIG. 7, and HS and VS are respectively the horizontal and vertical sync. signals. It is assumed that the display consists of only three waveform segments. The signals A and $\overline{A}$ (output from inverter 54) are clock signals, and the phase of the signal $\overline{A}$ is the inverted phase of the signal A. The predetermined memory area of RAM 44 stores the code signals of the basic patterns ("111" of the basic pattern H, "011" of D and "010" of C i.e., the data (address signals) of the addresses of the basic patterns stored in ROM 42) applied to terminal 44A via line 56 in accordance with the address signal applied to terminal 44B via line 58. These code signals are stored in RAM 44 in accordance with the contents of acquisition memory 14 (FIG. 4) under control of CPU 20. ROM 42 stores the logic signals shown in FIG. 7 in the addresses N+1 through N+24 as described hereinbefore. For displaying the timing waveform of FIG. 9, it is needed to read the logic signals from the addresses N+8, N+4, N+3, N+16, N+12, N+11, N+24, N+20 and N+19 of ROM 24 in this order. When displaying the logic signal timing waveform, terminals 44C and 44B of RAM 44 respectively receive the readout signal and the predetermined address signal for generating the code signal of the basic pattern at terminal 44D. Latch circuit 46 latches the code signal in response to the latch signal applied via line 62, and applies the latched signal to terminal 42B of ROM 42 for terminal 46C. ROM 42 further receives the line selection signal via line 64. ROM 42 applies the basic pattern signal as a parallel signal stored in the addresses N+8 through +24 from terminal 42C to terminal 48A of shift register 48 in accordance with the signals at terminals 42A and 42B. Shift register 48 converts the parallel signal at terminal 48A to the serial signals (B, $\overline{B}$) in accordance with the timing (clock) signal A via line 52 and the load signal D via line 50 (shift register 48 loads the parallel signal at the falling edge of the signal D), and the serial signals B, $\overline{B}$ are applied to terminal 40B and 40$\overline{B}$ of edge generator 40, respectively. Input terminal 40$\overline{A}$ of edge generator 40 receives the inverted clock signal $\overline{A}$ from phase shifter 54, and terminal 40C thereof receives the signal C from terminal 42D of ROM 42, wherein the signal C represents the position of the raster scan line (i.e., which does the pattern display waveform signals at terminals 48C and 48D correspond to the upper, lower or center line ?). Terminal 40D receives the load signal D via line 50.

The signal B is the logic signal stored in the addresses N+8 through N+24, and the signal $\overline{B}$ lags the signal B by phase difference of 180 degrees. If the signal C is "0", the scan line position is the upper or lower. If the signal C is "1", the scan line position is the center. Since the signal C does not pass through shift register 48, the signal C is leading the signals B and $\overline{B}$ as shown in FIG. 8. The signal C is applied to the data terminal D of D flip-flop 80 through buffer amplifier 78. Since D flip-flop 80 latches the signal C at the falling edge of the load signal D, the signal E from the terminal Q is synchronized with the signals B and $\overline{B}$. The signal E is applied to the input terminal 76A of OR circuit 76 which receives the signal B at the input terminal 76B. Thus, the output signal H from OR circuit 76 is obtained as shown in FIG. 8. D flip-flop 70 receives the signal $\overline{A}$ at the clock terminal and the signal $\overline{B}$ at the data terminal D. The signal F (output from the terminal Q of flip-flop 70) is delayed from the signal $\overline{B}$ by a half period of the clock A, since the signal $\overline{B}$ is acquired at the falling edge of the signal $\overline{A}$. The signal $\overline{F}$ lags the signal F by phase difference of 180 degrees. The signal F is applied to input terminal 74A of OR circuit 74 which receives the signal B at input terminal 74B. Thus, the output form OR circuit 74 is the signal G. The signal $\overline{F}$ is applied to input terminal 72B of OR circuit 72 which receives the signal $\overline{B}$ at input terminal 72A, so that the signal I is obtained from OR circuit 72. The outputs from OR circuits 72, 74 and 76 are applied to AND circuit 82 which generates the signal J. As described hereinbefore, the output signal J from AND circuit 82 is applied to the Z-axis of the CRT for controlling the intensity of the display screen. If "0" and "1" of the signal J are made to correspond to the black and white portions of the basic pattern respectively, the intensity of the screen is modulated as shown in K of FIG. 8. The horizontal sync. signal HS is generated at times T1 through T4, the timing waveform is displayed on the CRT as shown in FIG. 9. It should be noted that the transition width of the display waveform is a half of the clock width, since the signals B and $\overline{B}$ lag the signal F and $\overline{F}$ by a phase difference of a half of one clock period. In this embodiment, the vertical sync. signal VS is generated at the times T1 and T4.

The above description was made for the first embodiment of the present invention, however, a phase shifter may be used instead of inverter 54 for varying the transition width by controlling the shift value of the clock signal. If it is needed to display the timing waveform and characters (alphanumerics) stored in ROM 42 simultaneously, the output signal B from shift register 48 may not be passed through edge generator 40 while the characters signal is read out. However, this method is complex in circuit. Another method is to add an input terminal to each of OR circuit 72 and 74 in edge generator 40, and to apply "1" to the additional input terminals for eliminating the effects of the signals $\overline{B}$, F and $\overline{F}$ while displaying the characters.

As described hereinbefore, according to the present invention, the basic patterns are constructed by simplifying the transitions and levels of the display waveform, so that the number of the basic patterns is much less than a number of the conventional waveform segment patterns. Moreover, the logic signal timing waveform can be displayed by adding the simple logic circuit (edge generator 40), and the width of the transition can be less than one bit width of the display waveform. In addition, the width of the transition can be adjusted desirably. Thus, the present invention can decrease the memory area of the ROM, improve the usage efficiency of the memory circuit, and provide a display apparatus which is inexpensive to manufacture.

Figure 10:
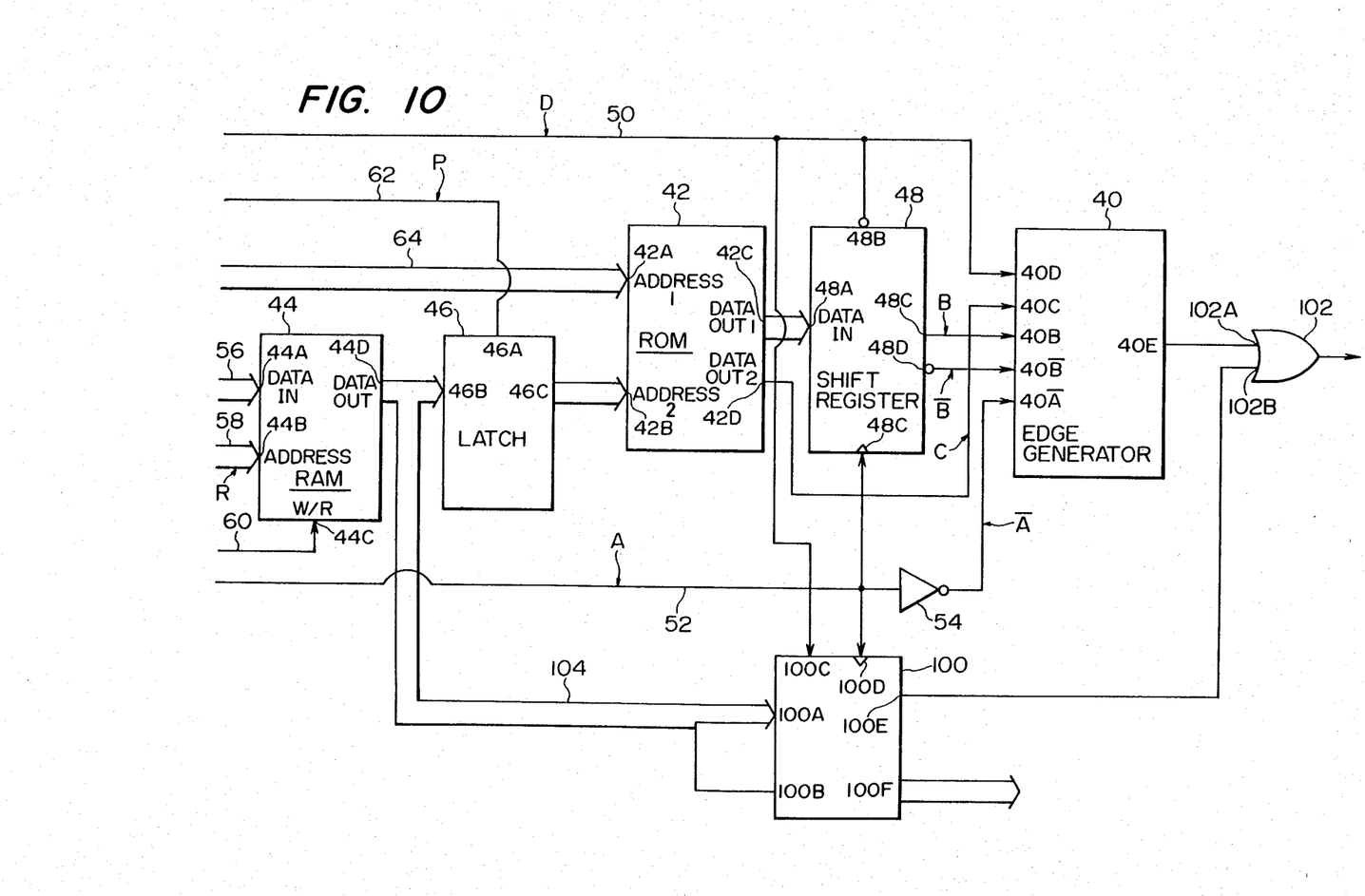
FIG. 10 shows a block diagram of another embodiment of a display apparatus according to the present invention.
Figure 11:
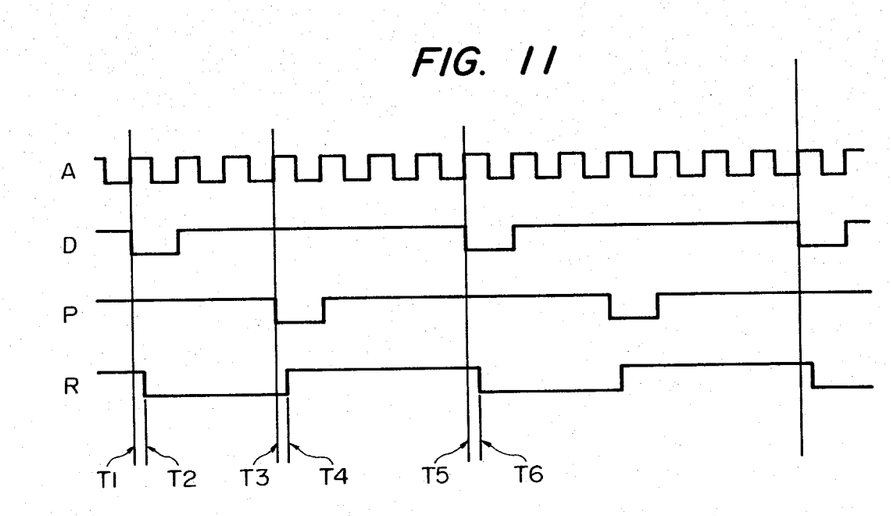
FIG. 11 shows a time chart for explaining the operation of FIG. 10.
Figure 12:
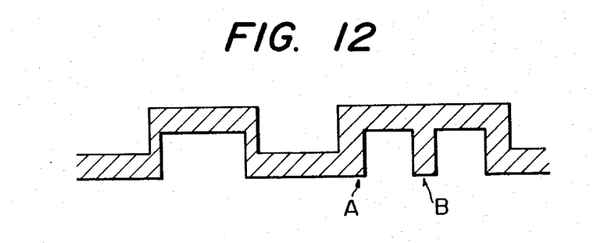
FIG. 12 shows a part of a displayed waveform model for explaining the operation of FIG. 10.

Another embodiment of the present invention will be discussed in conjunction with FIGS. 10 through 12, wherein FIG. 10 shows a block diagram of another embodiment according to the present invention, FIG. 11 is a time chart for explaining FIG. 10, and FIG. 12 shows a waveform for explaining a glitch display according to the present invention. The block diagram of FIG. 10 is accomplished by adding latch/parallel-to-serial converter 100 and OR circuit 102 to the block diagram of FIG. 5, and no description is made for the blocks which are the same or similar to the blocks of FIG. 5 and have no direct relation to the present invention. One object of this embodiment is to display the glitches as well as the timing waveform simultaneously, especially to display the glitches clearly even if the glitches are superimposed on the transitions. A second object of this embodiment is to improve the usage efficiency of RAM 44.

In FIG. 10, display RAM 44 stores FONT information and ATTRIBUTE information, and the FONT information from RAM 44 is latched by latch circuit 46 every one FONT. The FONT information includes waveform, character information or the like, and the ATTRIBUTE information include glitch, cursor, blanking, white-black reverse information, or the like which is stored in accordance with the contents of glitch memory 34 (FIG. 4) and the command signal from keyboard 28 under control of CPU 20. In this embodiment, the width of the waveform segment is seven bits for convenience of the explanation, and this width is different from the embodiment of FIGS. 1 through 9. Input terminals 100A and 100B of latch/parallel converter 100 are connected to output terminal 44D of RAM 44, input terminal 100C thereof receives the load signal D (FIG. 11) via line 50, and input terminal 100D thereof receives the clock signal A (FIG. 11) via line 52. Circuit 100 is controlled to act as a latch circuit or a prallel-to-serial converter in accordance with the signal applied to input terminal 100B. Output terminal 100E is connected to one input terminal 102B of OR circuit 102 for applying the glitch information to OR circuit 102. The other terminal 102A of OR circuit 102 is connected to output terminal 40E of edge generator 40 for receiving the timing information from edge generator 40 as described hereinbefore. Output terminal 100F of latch/parallel converter 100 is used for the blanking information, the white-black reverse information, the cursor information, or the like. In FIG. 11, P is a latch signal for latch circuit 46, and R is the address signal applied to input terminal 44B of RAM 44. At a time $T_1$ (FIG. 11), shift register 48 acquires the pattern waveform from output terminal 42C of ROM 42 in response to the falling edge of the load signal D, the pattern waveform in ROM 42 being selected by the address signal from latch circuit 46. At a time $T_2$, RAM 44 receives the next address signal via line 58 for selecting the new basic pattern waveform, and generates the basic pattern signal coresponding to the address signal at terminal 44D. At a time $T_3$, latch circuit 46 latches the FONT information from RAM 44 in response to the falling edge of the latch signal P. Since the FONT information is latched by latch circuit 46 at the time $T_3$, RAM 44 does not need to generate the next FONT information during a period from the time $T_3$ to a time $T_6$. According to this embodiment, RAM 44 applies the ATTRIBUTE information to latch/parallel converter 100 during the period from a time $T_3$ to the time $T_6$ so that RAM 44 can be used effectively.

When the ATTRIBUTE (glitch) information is applied from RAM 44 to input terminals 100A and 100B of latch/parallel converter 100, the converter 100 acts as a parallel-to-serial converter for applying the glitch information from output terminal 100E to input terminal 102B of OR circuit 102. Since the width of the transition is narrower than one bit width as described hereinbefore and the width of the glitch information is one bit width, the glitch can be recognized in the transition even if the glitch is superimposed on the transition because this transition is wider as shown by A of FIG. 12. B of FIG. 12 indicates the glitch occuring outside the transition. If the ATTRIBUTE information is the cursor, blanking or white-black reverse information, circuit 100 acts as a latch circuit for generating the constant information for one FONT period. According to this another embodiment of the present invention, RAM 44 can eliminate a waste time, and it is possible to distinquish the glitch even if the glitch is superimposed on the transition.

As understood from the foregoing description, the display apparatus of the present invention can save the capacity of the memory (ROM) for the logic waveform patterns and display the transitions of the logic waveform narrower than one bit width by storing special basic patterns in the memory and using the edge generator.

While we have shown and described herein preferred embodiments of the invention, it will be apparent to those skilled in the art that many changes and modifications may be made without departing from the invention in its broader aspects. For example the basic pattern can be made in consideration of the transitions and the levels, if the component bits of the waveform segments increase. The edge generator may be constructed by a circuit which displays the transition if the bit is different from the former bit in the line between the upper and lower lines. For example, an exclusive OR gate may be used as an edge generator. The intensity of the glitch may be modified for distinguishing the glitch from the timing waveform to indicate clearly the glitch to the operator.

What I claim as being novel is:

1. An apparatus for displaying a logic signal waveform on a display device comprising:

means for storing a plurality of predetermined basic patterns corresponding to segments of said logic signal waveform, each of said basic patterns being $M \times N$ bits where M is an integer greater than or equal to three corresponding to the number of raster lines of said logic signal waveform and N is an integer corresponding to the width of each of said segments, the N logic levels of corresponding upper (M=1) and lower (M=M) raster lines of said basic pattern being determined according to the logic levels of said logic signal waveform, said upper and lower raster lines having reverse logic level with respect to each other, and the N logic levels of corresponding intermediate (M<M<1) raster lines being the same as the logic levels of one of said corresponding upper and lower raster lines;

means for selectively reading said basic patterns from said storing means determined by said logic signal waveform; and     means for generating an output signal based upon said basic pattern, said output signal having a transition output for said intermediate raster lines based upon a comparison of the present bit with the former bit of said intermediate raster line and having an output for said upper and lower raster lines based upon the logic levels of said upper and lower raster lines such that said logic signal waveform is displayed according to said output signal.

2. An apparatus as recited in claim 1 wherein said storing means comprises a read only memory and said reading means comprises a random access memory for storing a code signal corresponding to said segments such that the output of said read only memory is the ones of said basic patterns corresponding to said code signal received as an address signal from said random access memory.

3. An apparatus as recited in claim 2 wherein said generating means comprises:

means for delaying said basic pattern from said storing means; and     means for comparing said basic pattern from said delaying means with said basic pattern from said storing means, the output of said comparing means being used to generate said output signal such that transitions of said logic signal waveform have a width narrower than one bit width.

4. An apparatus as recited in claim 3 wherein said delaying means comprises a D flip-flop having a D and a clock terminal, said basic pattern from said storing means being input to said D terminal and a clock signal being input to said clock terminal, said clock signal being delayed with respect to said basic pattern from said storing means.

* * * * *